United States Patent
Yang et al.

(10) Patent No.: US 8,713,397 B2
(45) Date of Patent: Apr. 29, 2014

(54) APPARATUS AND METHOD FOR LAYERED DECODING IN A COMMUNICATION SYSTEM USING LOW-DENSITY PARITY-CHECK CODES

(75) Inventors: Hyun-Koo Yang, Seoul (KR); Hong-Sil Jeong, Seoul (KR); Se-Ho Myung, Suwon-si (KR); Jae-Yoel Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 224 days.

(21) Appl. No.: 13/105,527

(22) Filed: May 11, 2011

(65) Prior Publication Data

US 2011/0283158 A1    Nov. 17, 2011

(30) Foreign Application Priority Data

May 11, 2010  (KR) .................. 10-2010-0044165

(51) Int. Cl.
*H03M 13/00* (2006.01)
*H03M 13/11* (2006.01)

(52) U.S. Cl.
CPC .......... *H03M 13/114* (2013.01); *H03M 13/116* (2013.01); *H03M 13/1137* (2013.01); *H03M 13/1177* (2013.01); *H03M 13/00* (2013.01)
USPC .......................................... 714/752; 714/758

(58) Field of Classification Search
CPC ............ H03M 13/114; H03M 13/116; H03M 13/1137; H03M 13/1177
USPC ....................................................... 714/752
See application file for complete search history.

(56) References Cited

U.S. PATENT DOCUMENTS

| | | | | |
|---|---|---|---|---|
| 7,139,959 B2* | 11/2006 | Hocevar | ........................ | 714/752 |
| 7,178,082 B2* | 2/2007 | Yu et al. | ........................ | 714/752 |
| 7,702,986 B2* | 4/2010 | Bjerke et al. | .................. | 714/755 |
| 7,730,377 B2* | 6/2010 | Hocevar | ........................ | 714/752 |
| 7,882,418 B2* | 2/2011 | Lee et al. | ....................... | 714/758 |
| 8,060,803 B2* | 11/2011 | Kim | ................................ | 714/752 |
| 8,086,929 B2* | 12/2011 | Chung et al. | .................. | 714/752 |
| 8,103,935 B2* | 1/2012 | Matsumoto et al. | .......... | 714/758 |

(Continued)

FOREIGN PATENT DOCUMENTS

| EP | 1 612 948 | 1/2006 |
|---|---|---|
| KR | 1020060057253 | 5/2006 |

(Continued)

OTHER PUBLICATIONS

Eran Sharon et al., "Efficient Serial Message-Passing Schedules for LDPC Decoding", IEEE Transactions on Information Theory, vol. 53, No. 11, Nov. 2007.

(Continued)

*Primary Examiner* — James C Kerveros
(74) *Attorney, Agent, or Firm* — The Farrell Law Firm, P.C.

(57) ABSTRACT

A channel decoding apparatus and method in a communication system using Low-Density Parity-Check (LDPC) codes are provided in which an encoded signal is received from a transmitter and decoded using a parity-check matrix. At least one of input orders and output orders of the parity-check matrix are determined so that same values are not overlapped in a column direction between the at least one of the input orders and the output orders.

8 Claims, 10 Drawing Sheets

(56) References Cited

U.S. PATENT DOCUMENTS

| | | | |
|---|---|---|---|
| 8,161,348 B2* | 4/2012 | Graef | 714/757 |
| 8,225,173 B2* | 7/2012 | Shasha | 714/758 |
| 8,225,174 B2* | 7/2012 | Okamura | 714/758 |
| 8,291,283 B1* | 10/2012 | Rad et al. | 714/752 |
| 8,291,285 B1* | 10/2012 | Varnica et al. | 714/752 |
| 8,347,170 B2* | 1/2013 | Chung et al. | 714/752 |
| 8,438,459 B2* | 5/2013 | Cho et al. | 714/781 |
| 2006/0015802 A1 | 1/2006 | Hocevar | |
| 2006/0123318 A1 | 6/2006 | Kim et al. | |
| 2007/0168832 A1 | 7/2007 | Richardson et al. | |

FOREIGN PATENT DOCUMENTS

| | | |
|---|---|---|
| KR | 1020070029846 | 3/2007 |
| KR | 1020090036662 | 4/2009 |
| WO | WO 2009/004572 | 1/2009 |

OTHER PUBLICATIONS

Cedric Marchand et al., "Conflict Resolution by Matrix Reordering for DVB-T2 LDPC Decoders", IEEE Global Telecommunications Conference, Nov. 30, 2009.

* cited by examiner

| $\sum_{l=1}^{b_{1,1}} P^{a_{1,1}^{(l)}}$ | $\sum_{l=1}^{b_{1,2}} P^{a_{1,2}^{(l)}}$ | $\sum_{l=1}^{b_{1,3}} P^{a_{1,3}^{(l)}}$ | ... | $\sum_{l=1}^{b_{1,n}} P^{a_{1,n}^{(l)}}$ |
|---|---|---|---|---|
| $\sum_{l=1}^{b_{2,1}} P^{a_{2,1}^{(l)}}$ | $\sum_{l=1}^{b_{2,2}} P^{a_{2,2}^{(l)}}$ | $\sum_{l=1}^{b_{2,3}} P^{a_{2,3}^{(l)}}$ | ... | $\sum_{l=1}^{b_{2,n}} P^{a_{2,n}^{(l)}}$ |
| ⋮ | ⋮ | ⋮ | ... | ⋮ |
| $\sum_{l=1}^{b_{m,1}} P^{a_{m,1}^{(l)}}$ | $\sum_{l=1}^{b_{m,2}} P^{a_{m,2}^{(l)}}$ | $\sum_{l=1}^{b_{m,3}} P^{a_{m,3}^{(l)}}$ | ... | $\sum_{l=1}^{b_{m,n}} P^{a_{m,n}^{(l)}}$ |

FIG.4

APPARATUS AND METHOD FOR LAYERED DECODING IN A COMMUNICATION SYSTEM USING LOW-DENSITY PARITY-CHECK CODES

PRIORITY

This application claims priority under 35 U.S.C. §119(a) to a Korean Patent Application filed in the Korean Intellectual Property Office on May 11, 2010 and assigned Serial No. 10-2010-0044165, the contents of which are incorporated herein by reference.

BACKGROUND OF THE INVENTION

1. Field of the Invention

The present invention relates generally to a communication system using Low-Density Parity-Check (LDPC) codes, and more particularly, to a channel decoding apparatus and method for decoding an LDPC code.

2. Description of the Related Art

LDPC codes are a subset of linear block codes. Although an LDPC code is generally defined by a party-check matrix, a bipartite graph, also known as a Tanner graph, can be used to represent the LDPC code. A bipartite graph is a graph whose nodes are divided into two sets, such that each node is connected to a node in the other set. The two sets of nodes on a Tanner graph are called variable nodes and check nodes. The variable nodes have a one-to-one correspondence to coded bits.

FIG. 1 illustrates a parity-check matrix $H_1$ with four rows and eight columns representing an LDPC code. Referring to FIG. 1, the number of columns (8) defines the length of an LDPC codeword, and the columns represent the eight coded bits in the parity-check matrix $H_1$.

FIG. 2 is a diagram illustrating a Tanner graph corresponding to the parity-check matrix $H_1$ illustrated in FIG. 1.

Referring to FIG. 2, the Tanner graph representing the LDPC code includes eight variable nodes 202, 204, 206, 208, 210, 212, 214 and 216 ($X_1, X_2, X_3, X_4, X_5, X_6, X_7, X_8$) and four check nodes 218, 220, 222 and 224. An $i^{th}$ column and $j^{th}$ row in the parity-check matrix $H_1$ represents a variable node $X_i$ and a $j^{th}$ check node, respectively. If an entry at the $i^{th}$ column and $j^{th}$ row in the parity-check matrix $H_1$ is one, i.e., non-zero, this means that an edge is drawn between the variable node $X_i$ and the $j^{th}$ check node on the Tanner graph illustrated in FIG. 2.

The degree of a variable node or a check node on the Tanner graph of the LDPC code is the number of edges connected to the node. The degree of a node is equal to the number of non-zero entries in a column or row corresponding to the node in the parity-check matrix of the LDPC code. For example, the degrees of the variable nodes 202, 204, 206, 208, 210, 212, 214 and 216 ($X_1, X_2, X_3, X_4, X_5, X_6, X_7, X_8$) are 4, 3, 3, 3, 2, 2, 2 and 2, respectively. The degrees of the check nodes 218, 220, 222 and 224 are 6, 5, 5 and 5, respectively. Likewise, the numbers of non-zeroes in the columns of the parity-check matrix of FIG. 1, corresponding to the variable nodes of FIG. 2, are 4, 3, 3, 3, 2, 2, 2 and 2, respectively, and the numbers of non-zeroes in the rows of the parity-check matrix of FIG. 1, corresponding to the check nodes of FIG. 2, are 6, 5, 5 and 5.

The features of a parity-check matrix representing an LDPC code of a particular structure are described with reference to FIG. 3. The LDPC code of the structure illustrated in FIG. 3 has been adopted as a digital broadcasting standard in Europe.

Referring to FIG. 3, $N_1$ denotes the length of an LDPC codeword, equal to the length of the parity-check matrix. $K_1$ denotes the length of an information word, equal to the length of an information part in the parity-check matrix. $(N_1-K_1)$ denotes the length of parity bits, equal to the length of a parity part in the parity-check matrix. Integers $M_1$ and q are determined such that $q=(N_1-K_1)/M_1$. Herein, $K_1/M_1$ is also an integer. For the sake of convenience, the parity-check matrix illustrated in FIG. 3 is referred to as a first parity-check matrix $H_1$.

In the parity part of the parity-check matrix illustrated in FIG. 3, from a $K_1^{th}$ column to an $(N_1-1)^{th}$ column, the positions of weights preferably form, but are not limited to, a dual-diagonal structure. Therefore, the degrees of the columns in the parity part are all 2, except for the $(N_1-1)^{th}$ column of degree 1.

The LDPC code of the above-described structure is generally represented by a parity-check matrix. Accordingly, efficient storage of information of the parity check matrix reduces a required memory size. If the LDPC code is stored in a conventional manner, a relatively large memory capacity is needed. In this context, many techniques have been studied to efficiently store the LDPC code.

For example, various Quasi-Cyclic LDPC (QC-LDPC) codes have been developed based on circulant permutation matrices in order to improve memory efficiency.

The QC-LDPC code may be represented by a parity-check matrix divided into small blocks. Each small block may be a circulant permutation matrix, the sum of two or more circulant permutation matrices, or a zero matrix. The QC-LDPC code is described in detail below with reference to FIG. 4.

FIG. 4 illustrates a parity-check matrix representing a typical QC-LDPC code. The parity-check matrix of the QC-LDPC code is divided into a plurality of partial blocks, each partial block being the sum of permutation matrices. The parity-check matrix illustrated in FIG. 4 includes m block rows and n block columns. An entry in an $i^{th}$ block row and a $j^{th}$ block column is the sum of permutation matrices. Notably, $b_{ij}$ is 0 or a larger integer. In FIG. 4, reference character P denotes a permutation matrix having size $N_S \times N_S$ as shown in Equation (1). The superscript of P, $a_{i,j}^{(l)}$ satisfies $0 \leq a_{i,j}^{(l)} \leq N_S - 1$.

Equation (1) is an example of the permutation matrix P illustrated in FIG. 4.

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & \cdots & 0 \end{bmatrix} \quad (1)$$

The above permutation matrix P is a square matrix of size $N_S \times N_S$ in which each of the $N_S$ rows has a weight 1 and each of the $N_S$ columns has a weight 1. Hereinafter, the size of the permutation matrix P, $N_S \times N_S$ is shortened as $N_S$ for convenience because the permutation matrix P is square.

If the superscript $a_{i,j}^{(l)}$ of P is 0, the permutation matrix $P^0$ is a unit matrix $I_{N_S \times N_S}$. If $b_{i,j}$ is 0, the sum of permutation matrices P, $$\sum_{l=1}^{b_{i,j}} P^{p_{i,j}^{(l)}}$$

is a zero matrix 0.

For an irregular LDPC code, information about the positions of all weights of a parity-check matrix representing the irregular LDPC code should be stored. Compared to an irregular LDPC code, only information about the positions of weights in the first column or row of each small block needs to be stored for a QC-LDPC code because once the positions of weights in the first column or row of each small block are determined, the positions of weights in the other columns or rows can be determined in the small block. As a consequence, about $1/N_S$ of a memory capacity required for a general irregular LDPC code is sufficient for the QC-LDPC code. In other words, the QC-LDPC code outperforms the irregular LDPC code in terms of memory efficiency.

Layered decoding is a decoding scheme in which the rows of a parity-check matrix used for LDPC encoding and decoding are divided into a plurality of layers and the layers are iteratively decoded. A layer is defined as a group of rows divided from the parity-check matrix. Specifically, when the rows of the parity-check matrix are divided into a plurality of groups, each group is referred to as a layer. The layer may be one row. The layered decoding enables partial parallel decoding.

If the same position is accessed for two or more computations during the layered decoding, a memory collision may occur. To avert this problem, an additional memory or scheduling may be required.

SUMMARY OF THE INVENTION

The present invention has been made to address at least the above problems and/or disadvantages and to provide at least the advantages described below. Accordingly, an aspect of the present invention provides a method and apparatus for efficiently designing a decoder for performing layered decoding on an LDPC code with at least one block being the sum of two or more permutation matrices in a communication system using LDPC codes.

Another aspect of the present invention provides a layered decoding apparatus and method for reducing memory collisions in a communication system using LDPC codes.

According to one aspect of the present invention, a channel decoding method is provided in which an encoded signal is received from a transmitter and decoded using a parity-check matrix. At least one of input orders and output orders of the parity-check matrix are determined so that same values are not overlapped in a column direction between the at least one of the input orders and the output orders.

According to another aspect of the present invention, a channel decoding apparatus is provided in which a receiver receives an encoded signal from a transmitter, and a decoder decodes the received signal using a parity-check matrix. At least one of input orders and output orders of the parity-check matrix are determined so that same values are not overlapped in a column direction between at least one of the input orders and the output orders.

BRIEF DESCRIPTION OF THE DRAWINGS

The above and other aspects, features and advantages of the present invention will be more apparent from the following detailed description when taken in conjunction with the accompanying drawings, in which:

FIG. 4 illustrates a parity-check matrix representing a QC-LDPC code;

DETAILED DESCRIPTION OF EMBODIMENTS OF THE PRESENT INVENTION

Figures 1, 2:
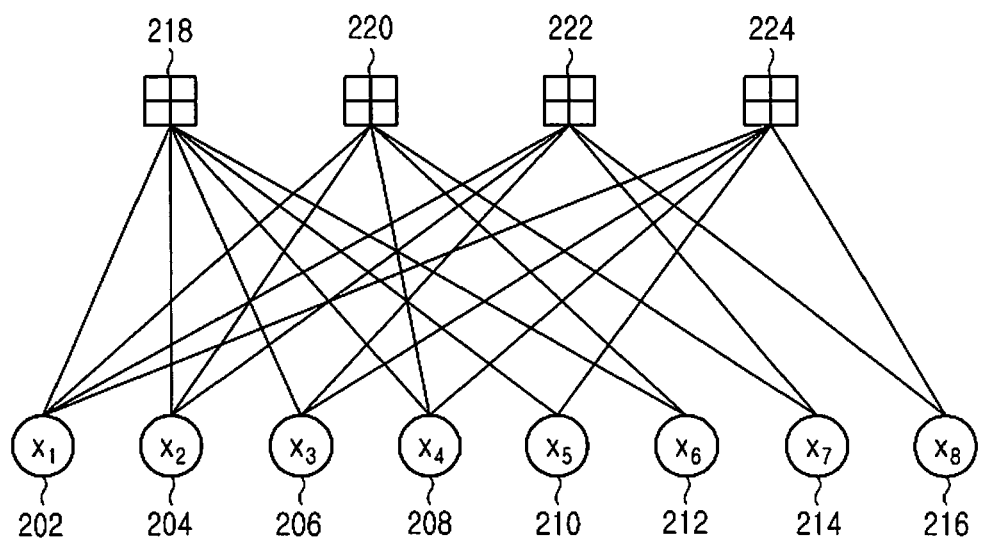
FIG. 1 illustrates a parity-check matrix representing a LDPC code of length 8.
FIG. 2 is a diagram illustrating a Tanner graph corresponding to the parity-check matrix representing the LDPC code of length 8.
Figure 3:
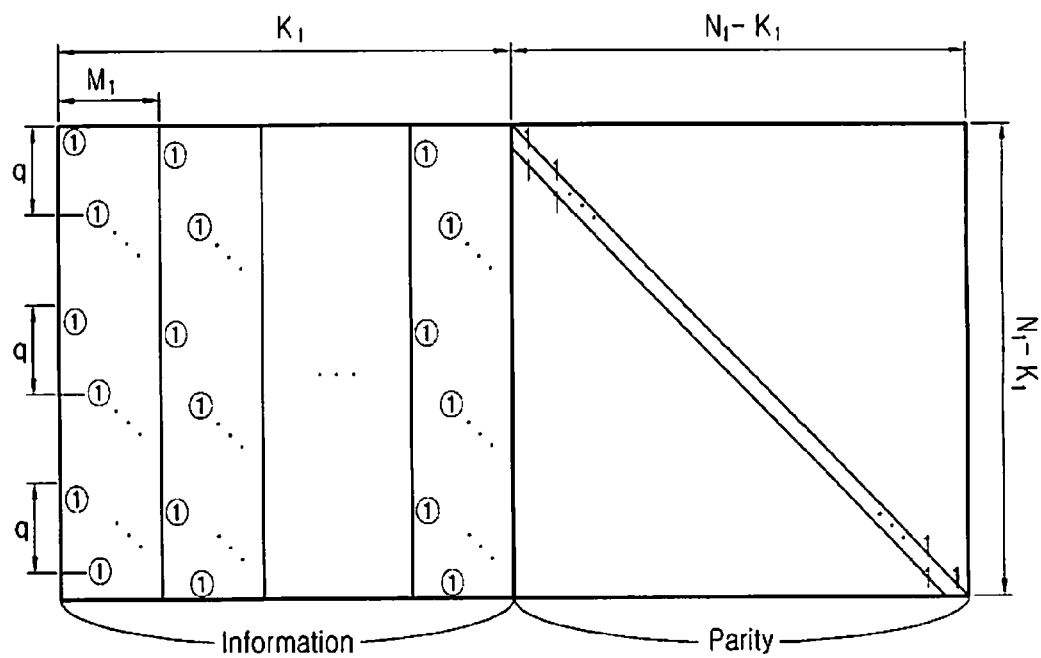
FIG. 3 is a diagram illustrating the structure of an LDPC code.

Embodiments of the present invention are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

An embodiment of the present invention provides a method for grouping a parity-check matrix and a message passing method, for layered decoding of a LDPC code in order to prevent memory collisions. Specifically, an embodiment of the present invention provides a method for grouping a parity-check matrix and a message passing method, for layered decoding of a QC-LDPC code with at least one block being the sum of a plurality of permutation matrices. In addition, an embodiment of the present invention provides an apparatus for supporting layered decoding and a method for controlling the apparatus in a communication system using the QC-LDPC code.

Figure 5:
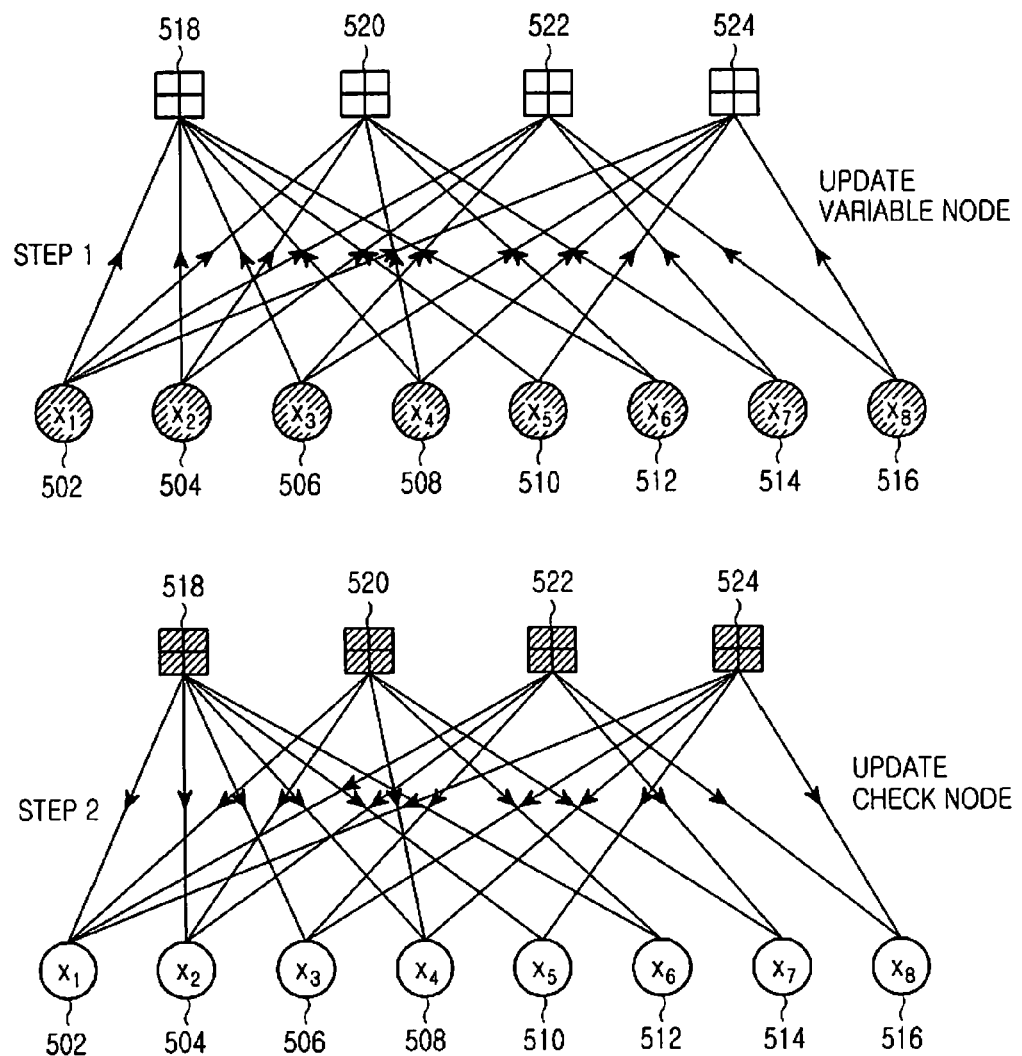
FIG. 5 is a diagram illustrating a flooding decoding algorithm, according to an embodiment of the present invention.

FIG. 5 is a diagram illustrating a flooding decoding algorithm for the LDPC code represented by the Tanner graph of FIG. 2, according to an embodiment of the present invention.

Flooding decoding is the most common message passing scheme used for LDPC decoding. As illustrated in FIG. 5, all messages are passed from variable nodes 502, 504, 506, 508, 510, 512, 514 and 516 to check nodes 518, 520, 522 and 524 in step 1, and from check nodes 518, 520, 522 and 524 back to variable nodes 502, 504, 506, 508, 510, 512, 514 and 516 in step 2, at each iteration. Flooding decoding allows parallel processing, thereby minimizing a decoding delay.

A set of check nodes connected to a variable node v are denoted by M(v) and a set of variable nodes connected to a check node c are denoted by N(c). A flooding decoding algorithm is implemented as follows.

---

Input: a maximum number of iterations $l_{max}$ and a channel input message $m_v$
Output: an estimated LDPC codeword vector $\hat{c}$
Initialization: $m_{cv}^{(0)}$ is 0 for every v and c
for $l = 1$ to $l_{max}$ do -continued $$m_{vc}^{(l)} = m_v + \sum_{c' \in M(v) \backslash c} m_{c'v}^{(l-1)} \text{ for all } v, c \in M(v)$$

$$\tanh\left(\frac{m_{cv}^{(l)}}{2}\right) = \left(\prod_{v' \in N(c) \backslash v} \tanh\left(\frac{m_{v'c}^{(l)}}{2}\right)\right) \text{ for all } c, v \in N(c)$$

end for

In the flooding decoding algorithm, $m_v$ is the Log-Likelihood Ratio (LLR) message value obtained from a channel corresponding to the variable node v, and $m_{cv}^{(l)}$ is a message value passed from the check node c to the variable node v during an $l^{th}$ iterative decoding. Therefore, if N variable nodes and E weights are defined on a Tanner graph representing an LDPC code, an LDPC decoder using the flooding decoding algorithm needs (N+2E) memory areas.

In layered decoding, the rows of a parity-check matrix are processed on a group basis or a layer basis. Compared to flooding decoding, layered decoding has the benefit of fast decoding convergence. Groups are processed sequentially in a predetermined order and each group is processed using updated information resulting from processing the previous group.

Figure 6:
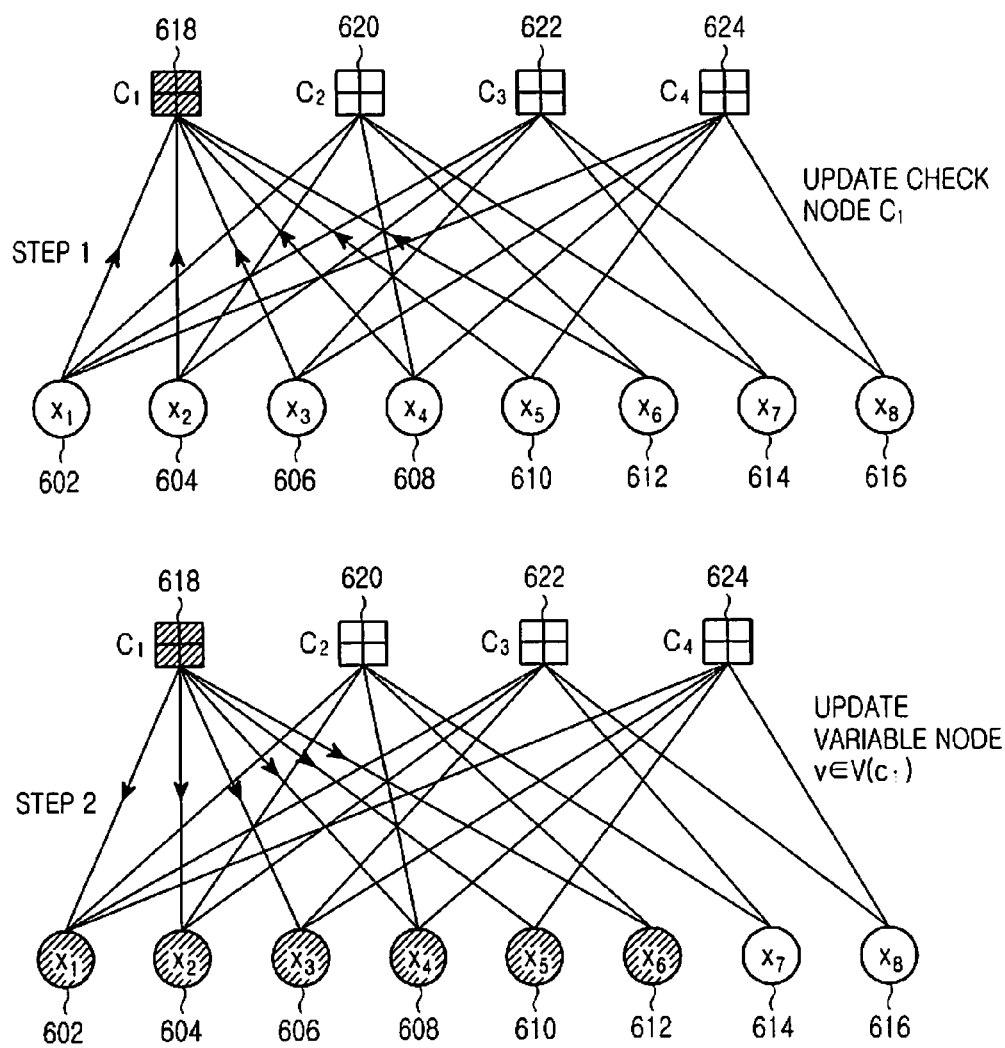
FIGS. 6 to 9 are diagrams illustrating a layered decoding algorithm, according to an embodiment of the present invention.

FIGS. 6 to 9 are diagrams illustrating a layered decoding method for decoding the LDPC code represented by the Tanner graph of FIG. 2, according to an embodiment of the present invention. FIG. 6 shows first variable nodes 602, 604, 606, 608, 610, 612, 614 and 616, and check nodes 618, 620, 622 and 624.

Referring to FIG. 6, during each iteration, the first variable nodes 602, 604, 606, 608, 610 and 612 pass messages to the check node 618 (step 1) and the check node 618 passes messages back to the variable nodes 602, 604, 606, 608, 610 and 612 (step 2) in the layered decoding method.

Figure 7:
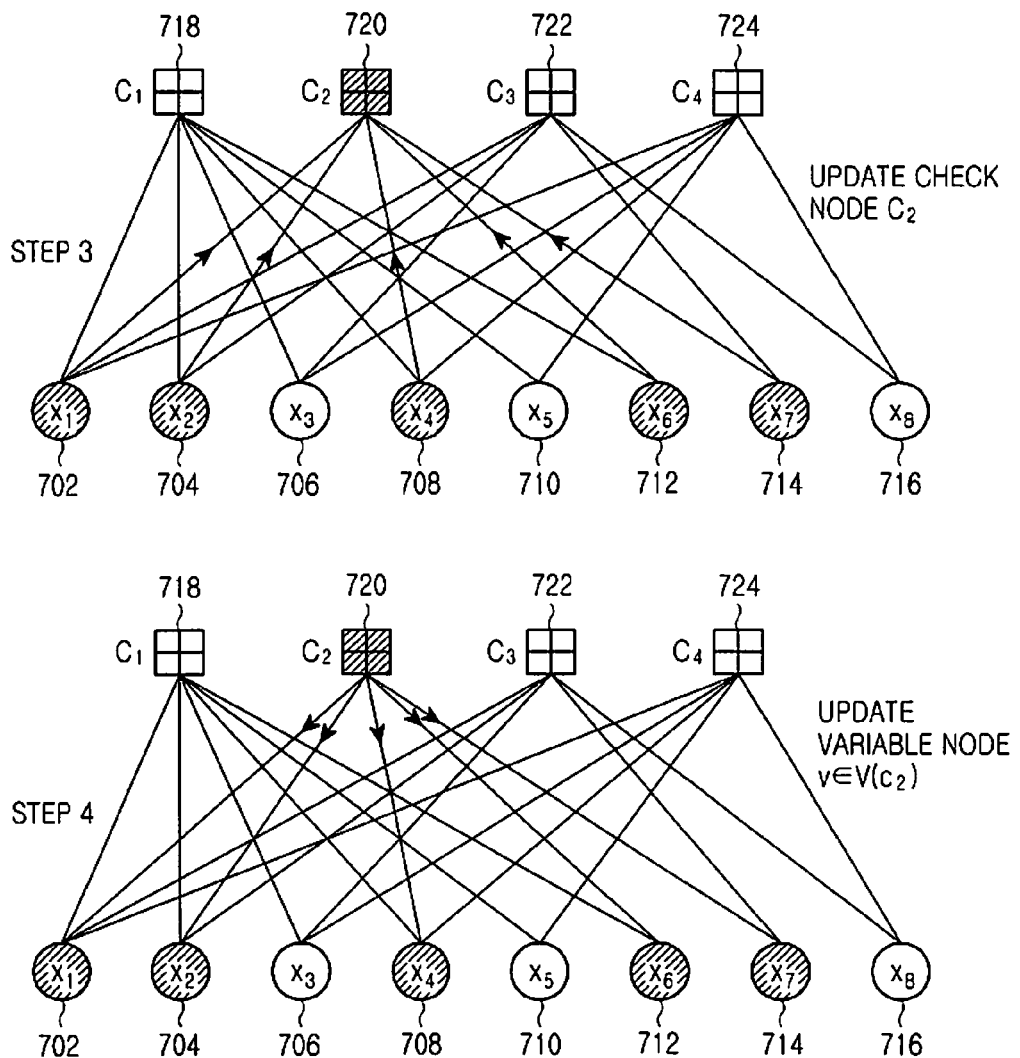
Figure 8:
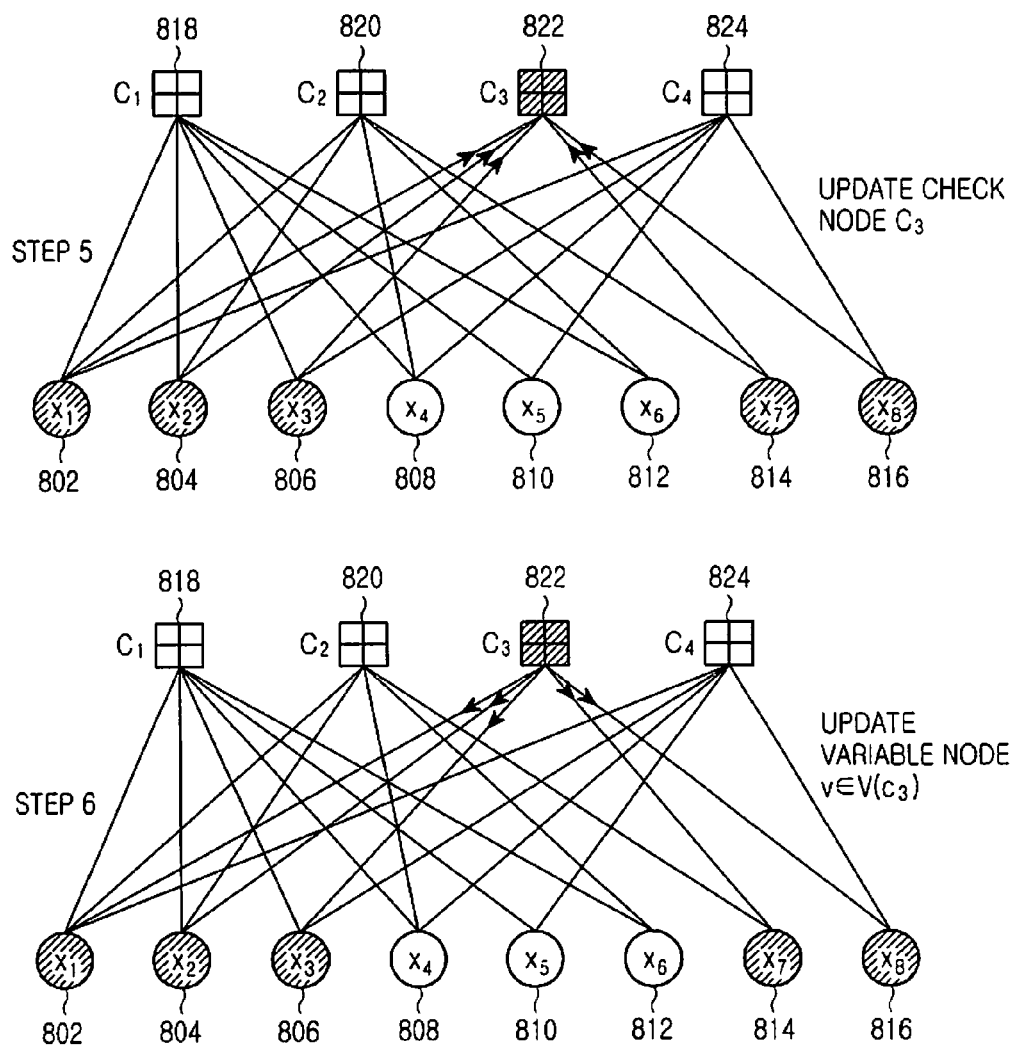
Figure 9:
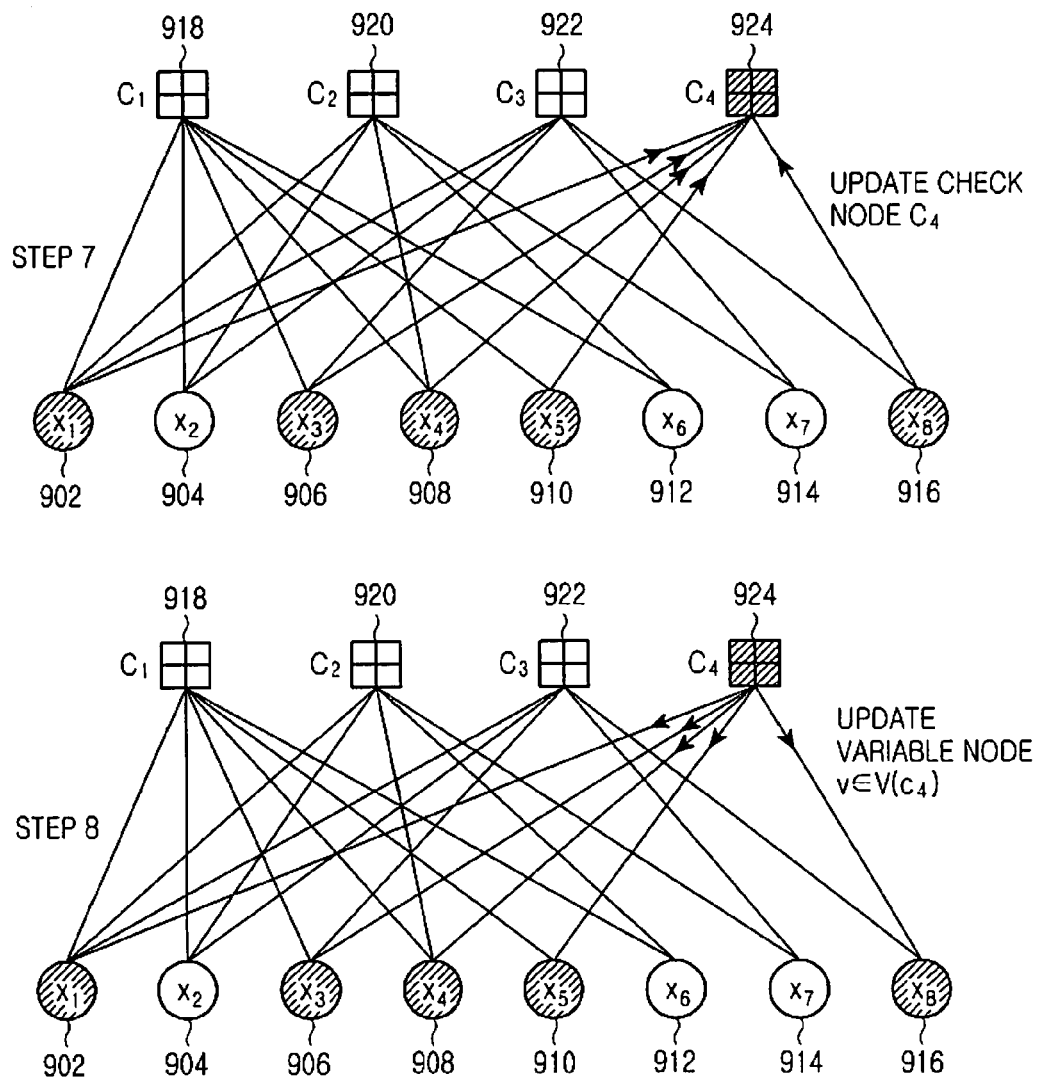

For each of the other check nodes 620, 622 and 624, the same operation is sequentially repeated, as shown in FIGS. 7, 8 and 9.

FIG. 7 shows first variable nodes 702, 704, 706, 708, 710, 712, 714 and 716, and check nodes 718, 720, 722 and 724. The first variable nodes 702, 704, 708, 712 and 714 pass messages to the check node 720 (step 3) and the check node 720 passes messages back to the variable nodes 702, 704, 708, 712 and 714 (step 4) in the layered decoding method.

FIG. 8 shows first variable nodes 802, 804, 806, 808, 810, 812, 814 and 816, and check nodes 818, 820, 822 and 824. The first variable nodes 802, 804, 806, 814 and 816 pass messages to the check node 822 (step 5) and the check node 822 passes messages back to the variable nodes 802, 804, 806, 814 and 816 (step 6) in the layered decoding method.

FIG. 9 shows first variable nodes 902, 904, 906, 908, 910, 912, 914 and 916, and check nodes 918, 920, 922 and 924. The first variable nodes 902, 906, 908, 910 and 916 pass messages to the check node 924 (step 7) and the check node 924 passes messages back to the variable nodes 902, 906, 908, 910 and 916 (step 8) in the layered decoding method.

When messages are passed to all check nodes, one iterative decoding is completed.

However, sequential decoding for every check node significantly increases a decoding delay despite an increased convergence speed. Thus, total check nodes are generally divided into G sets, and flooding decoding is performed within each set, while sequential decoding is performed across the check node sets. The G check node sets are denoted by $C_1, C_2, \ldots, C_G$. A layered decoding algorithm for an LDPC code is provides below.

Input: a maximum number of iterations $l_{max}$ and a channel input message $m_v$
Output: an estimated LDPC codeword vector $\hat{c}$
Initialization: $m_{cv}^{(0)}$ is 0 for every v and c and $m_v^{(l)} = m_v$
for l = 1 to $l_{max}$ do
  for i = 1 to G do $$\tanh\left(\frac{m_{cv}^{(l)}}{2}\right) = \left(\prod_{v' \in N(c) \backslash v} \tanh\left(\frac{m_{v'}^{(l)} - m_{cv'}^{(l-1)}}{2}\right)\right) \text{ for } c \in C_i, v \in N(c),$$

$m_v^{(l)} = m_v^{(l)} - m_{cv}^{(l-1)} + m_{cv}^{(l)}$ for $c \in C_i, v \in N(c)$,
  end for
end for In the layered decoding algorithm, $m_v$ is the LLR message value obtained from a channel corresponding to the variable node v, and $m_{cv}^{(l)}$ is a message value passed from the check node c to the variable node v during an $l^{th}$ iterative decoding. $m_{vc}^{(l)}$ is the a posteriori probability of the variable node v during the lth iterative decoding. While $m_{vc}^{(l)}$ is updated only once at each iteration in the flooding decoding algorithm, $m_{vc}^{(l)}$ may be updated a plurality of times at each iteration in the layered decoding algorithm. For the updating, the constraint is imposed that the weights of check nodes within the same check node group should be positioned in different columns. If the constraint is satisfied, the LDPC decoder using the layered decoding algorithm needs (N+E) memory areas, thereby enabling an efficient hardware configuration relative to the flooding decoding algorithm.

An LDPC code with the same structure as illustrated in FIG. 4 except for one bit, represented by a parity-check matrix with $0 \leq b_{i,j} \leq 2$ is applicable to a Digital Video Broadcasting-Second Generation Terrestrial 2 (DVB-T2), DVB-Satellite Second Generation (DVB-S2), DVB-Cable Second Generation (DVB-C2), or Digital Video Broadcasting-Next Generation Handheld (DVB-NGH) system which is under standardization. For an efficient hardware configuration to perform layered decoding, the constraint is imposed that the weights of rows in each group should be positioned in different columns in a parity-check matrix.

If the number of check nodes in each check node group, $N_G$ is a divisor of $N_S$ and $0 \leq b_{i,j} \leq 1$, the parity-check matrix of FIG. 4 satisfies the constraint for layered decoding. On the other hand, if $b_{i,j} > 1$, the parity-check matrix does not satisfy the constraint for layered decoding, thus significantly decreasing the efficiency of the layered decoder.

An embodiment of the present invention provides a method for grouping a parity-check matrix and a message passing method, for layered LDPC decoding.

If there are N variable codes and M check nodes on a Tanner graph representing an LDPC code, specifically, the LDPC code is defined by a parity-check matrix with size M×N, the check nodes are divided into G sets, $C_1, C_2, \ldots, C_G$. For convenience, it is assumed that each of the G sets $C_1, C_2, \ldots, C_G$ includes the same number of check nodes, $N_G$. In general, an LDPC decoder uses a plurality of node processors in parallel to increase throughput. Thus $N_G$ is the number of node processors, which is determined according to hardware configuration constraints.

For an efficient hardware configuration that performs layered decoding, the constraint is imposed that the weights of rows in each group are positioned in different columns in a parity-check matrix. Given $N_G$ check nodes, there is no guarantee that any parity-check matrix satisfies the constraint. To solve this problem, an embodiment of the present invention further divides each of the check node groups into sub-groups and performs layered decoding on the sub-groups as set forth below.

---

Input: a maximum number of iterations $l_{max}$ and a channel input message $m_v$
Output: an estimated LDPC codeword vector $\hat{c}$
Initialization: $m_{cv}^{(0)}$ is 0 for every v and c and $m_v^{(l)} = m_v$
for l = 1 to $l_{max}$ do
    for i = 1 to G do
        for j = 1 to $G_i$ do $$\tanh\left(\frac{m_{cv}^{(l)}}{2}\right) = \left(\prod_{v' \in N(c)\backslash v} \tanh\left(\frac{m_{v'}^{(l)} - m_{cv'}^{(l-1)}}{2}\right)\right) \text{ for } c \in C_i^{(j)}, v \in N(c),$$

$m_v^{(l)} = m_v^{(l)} - m_{cv}^{(l-1)} + m_{cv}^{(l)}$ for $c \in C_i^{(j)}, v \in N(c)$,
        end for
    end for
end for

---

In the multi-layered decoding algorithm shown above, each check node group $C_i$ ($1 \le i \le G$) is divided into $G_i$ sub-groups $C_i^{(j)}$ ($1 \le j \le G_i$). $G_i$ is an integer greater than or equal to 1 and may be different for different groups. For each check node $c_i$ ($1 \le i \le M$), two sequences are defined as set forth in Equation (2) below.

$$a_i = \{a_i^{(1)}, a_i^{(2)}, \ldots, a_i^{(di)}\}$$

$$b_i = \{b_i^{(1)}, b_i^{(2)}, \ldots, b_i^{(di)}\} \quad (2)$$

$d_i$ is the degree of a check node $c_i$, and $a_i^{(j)}$ and $b_i^{(j)}$ are the indexes of variable nodes connected to the check node $c_i$. In the multi-layered decoding algorithm, when a check node processor processes the check node $c_i$, variable node messages are input in the order of the sequence $a_i$ and updated messages are passed to variable nodes in the order of the sequence $b_i$ as described in Equation (2). Herein, for all check nodes within each sub-group $C_i^{(j)}$, the sequences $a_i$ and $b_i$ should have different elements for each j in Equation (2). This implies that none of the check nodes of the sub-group $C_i^{(j)}$ refer to a message of the same variable node, for input or output.

The parity-check matrix illustrated in FIG. 1 is divided into two groups. The groups are sequentially processed in a predetermined order and each group is processed using updated information resulting from processing the previous group.

$a_1$ and $a_2$ specify input orders and $b_1$ and $b_2$ specify output orders.

For example, the parity-check matrix is divided into two groups, $C_1 = \{c_1, c_2\}$ and $C_2 = \{c_3, c_4\}$ to prevent memory collisions. Within the same group, different input orders are used such that inputs are not overlapped between the input orders, such as $a_1 = \{1,2,3,4,5,6\}$ and $a_2 = \{7,6,4,2,1\}$. Likewise, within the same group, different output orders are used such that outputs are not overlapped between the output orders, such as $b_1 = \{1,2,3,4,5,6\}$ and $b_2 = \{7,6,4,2,1\}$.

In accordance with a first embodiment of the present invention a method is provided for efficiently designing a layered LDPC decoder.

A multi-layered decoding algorithm according to the first embodiment of the present invention is provided below.

G=2

$C_1 = \{c_1, c_2\} C_1^{(1)} = \{c_1, c_2\}$, $a_1 = \{1,2,3,4,5,6\} b_1 = \{1,2,3,4,5,6\}$, $a_2 = \{7,6,4,2,1\} b_2 = \{7,6,4,2,1\}$, $C_2 = \{c_3, c_4\} C_2^{(1)} = \{C_3, c_4\}$, $a_3 = \{1,2,3,7,8\} b_3 = \{1,2,3,7,8\}$, $a_4 = \{8,5,4,3,1\} b_4 = \{8,5,4,3,1\}$.

Another embodiment of the present invention provides a method for efficiently designing a layered decoder for decoding an LDPC code including a QC-LDPC code in which one block is the sum of two or more permutation matrices ($P^0 + P^2$).

$a_1, a_2, a_3$ and $a_4$ specify input orders and $b_1, b_2, b_3$ and $b_4$ specify output orders.

Referring to the following multi-layered decoding algorithm, different input orders are used so that inputs are not overlapped between the input orders, such as $a_1 = \{1,4\}$ and $a_2 = \{2,1\}$, and $a_3 = \{3,2\}$ and $a_4 = \{4,3\}$.

The multi-layered decoding algorithm according to this second embodiment of the present invention is provided below.

$$P^0 + P^2 = \begin{bmatrix} 1 & 0 & 0 & 1 \\ 1 & 1 & 0 & 0 \\ 0 & 1 & 1 & 0 \\ 0 & 0 & 1 & 1 \end{bmatrix}$$

$C_1 = \{c_1, c_2, c_3, c_4\}, C_1^{(1)} = \{c_1, c_2, c_3, c_4\}$, $a_1 = \{1,4\} b_1 = \{1,4\}$, $a_2 = \{2,1\} b_2 = \{2,1\}$, $a_3 = \{3,2\} b_3 = \{3,2\}$, $a_4 = \{4,3\} b_4 = \{4,3\}$.

In the second embodiment of the present invention, the same inputs are not overlapped in a column direction, such as $a_1, a_2, a_3$ and $a_4$, and the same outputs are not overlapped in a column direction such as $b_1, b_2, b_3$ and $b_4$.

Figure 10:
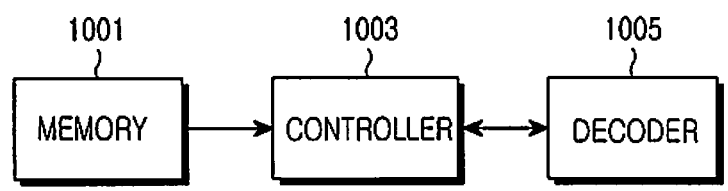
FIG. 10 is a block diagram of a receiver, according to an embodiment of the present invention.

FIG. 10 is a block diagram of a receiver, according to an embodiment of the present invention.

Referring to FIG. 10, the receiver includes a memory 1001, a controller 1003, and a decoder 1005.

The memory 1001 stores a parity-check matrix representing an LDPC code. The parity-check matrix may be retrieved from the memory 1001, received from a transmitter, or generated from the transmitter.

The controller 1003 divides the parity-check matrix into N groups, divides the rows of each group into sub-groups, and determines input and/or output orders for each group or sub-group. The determination may be made on the input and/or output orders, according to the first or second embodiment of the present invention.

The decoder 1005 decodes the rows of each group or sub-group according to the input and/or output orders.

Figure 11:
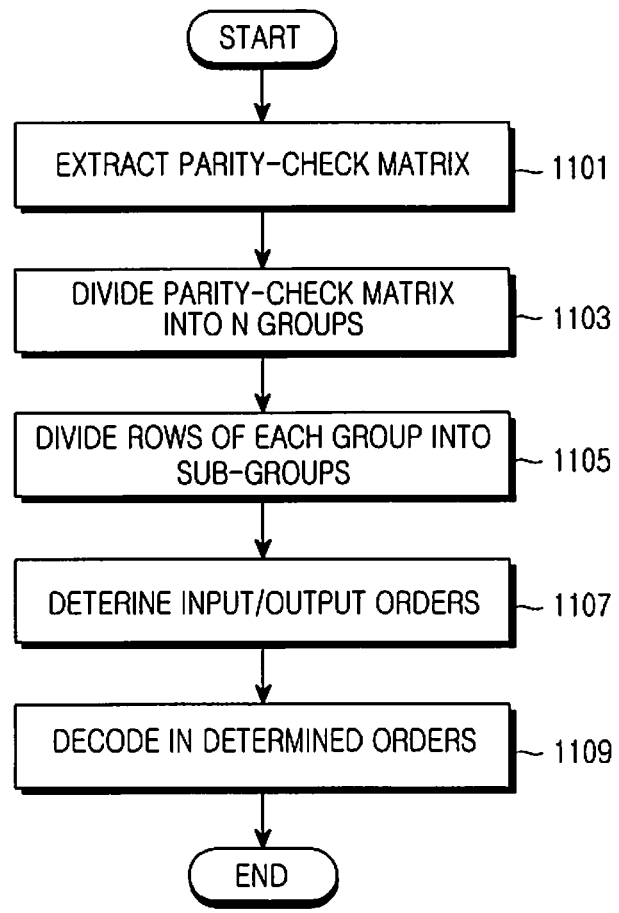
FIG. 11 is a flowchart illustrating a reception operation in the receiver, according to an embodiment of the present invention.

FIG. 11 is a flowchart illustrating a reception operation in the receiver, according to an embodiment of the present invention.

Referring to FIG. 11, the controller 1003 extracts a parity-check matrix representing an LDPC code from the memory 1001, in step 1101. The parity-check matrix may be retrieved from the memory 1001, received from a transmitter, or generated from the transmitter.

The controller 1003 divides the parity-check matrix into N groups in step 1103, divides the rows of each group into sub-groups in step 1105, and determines input and/or output orders for each group or sub-group in step 1107. The determination may be made on the input and/or output orders, according to the first or second embodiment of the present invention.

In step 1109, the decoder 1005 decodes the rows of each group or sub-group, according to the input and/or output orders.

As is apparent from the above description of embodiments of the present invention, a layered decoder for decoding LDPC codes including a QC-LDPC code in which one block is the sum of two or more permutation matrices can be efficiently designed.

With a smaller number of decoding iterations, the layered decoder outperforms a flooding decoder operating based on the premise that all messages are simultaneously passed.

Further, memory collisions can be prevented.

While the present invention has been shown and described with reference to embodiments thereof, it will be understood by those of ordinary skill in the art that various changes in form and detail may be made therein without departing from the spirit and scope of the present invention as defined by the following claims.

What is claimed is:

1. A channel decoding method comprising the steps of:
    extracting a parity-check matrix;
    grouping rows of the parity-check matrix into one or more groups;
    grouping rows of each group into one or more sub-groups, if the each group has two or more non-zero elements in a column direction; and
    determining input and/or output orders for each row of the one or more sub-groups,
    wherein each row of the one or more sub-groups is processed in parallel.

2. The channel decoding method of claim 1, wherein grouping rows comprises:
    grouping rows of the parity-check matrix to avoid overlapping input and/or output values in the column direction between rows of each group.

3. The channel decoding method of claim 1, wherein determining comprises:
    determining at least one of the input orders and the output orders of the grouped rows to avoid overlapping input and/or output values in the column direction between layers of each group.

4. The channel decoding method of claim 1, wherein, when a Quasi-Cyclic Low-Density Parity-Check (QC-LDDC) code is layer-decoded, input and/or output values are not overlapped in the column direction between adjacent layers in the parity check matrix, wherein the QC-LDPC has one block being a sum of two or more permutation matrices.

5. A channel decoding apparatus comprising:
    an extractor for extracting a parity-check matrix; and
    a controller for grouping rows of the parity-check matrix into one or more groups, grouping rows of each group into one or more sub-groups, if the each group has two or more non-zero elements in a column direction, and determining input and/or output orders for each row of the one or more sub-groups,
    wherein each row of the one or more sub-groups is processed in parallel.

6. The channel decoding apparatus of claim 5, wherein the controller groups the rows of the parity-check matrix so that input and/or output values are not overlapped in the column direction between rows of each group.

7. The channel decoding apparatus of claim 5, wherein at least one of the input orders and the output orders of the grouped rows are determined so that input and/or output values are not overlapped in the column direction between layers of each group.

8. The channel decoding apparatus of claim 5, wherein when a Quasi-Cyclic Low-Density Parity-Check (QC-LDPC) code is layered-decoded, input and/or output values are not overlapped in the column direction between adjacent layers in the parity check matrix, wherein the QC-LDPC has one block being a sum of two or more permutation matrices.

* * * * *